United States Patent [19]

McKinnon et al.

[11] Patent Number: 4,862,083

[45] Date of Patent: Aug. 29, 1989

[54] MAGNETIC RESONANCE EXAMINATION APPARATUS AND METHOD OF OPERATION THEREOF

[75] Inventors: Graeme C. McKinnon, Zürich; Peter Bösiger, Ennetbaden, both of Switzerland

[73] Assignee: U.S. Philips Corporation, New York, N.Y.

[21] Appl. No.: 221,154

[22] Filed: Jul. 19, 1988

[30] Foreign Application Priority Data

Jul. 22, 1987 [DE] Fed. Rep. of Germany ....... 3724157

[51] Int. Cl.$^4$ ............................................ G01R 33/20
[52] U.S. Cl. ................................... 324/309; 324/307
[58] Field of Search ............... 324/300, 307, 309, 310, 324/311, 312, 313, 314, 322; 128/653

[56] References Cited

U.S. PATENT DOCUMENTS

| 4,471,306 | 9/1984 | Edelstein | 324/309 |
| 4,480,228 | 10/1984 | Bottomley | 324/307 |
| 4,506,223 | 3/1985 | Bottomley | 324/309 |
| 4,684,893 | 8/1987 | Kojima | 324/309 |

FOREIGN PATENT DOCUMENTS 0143602 6/1985 European Pat. Off. .

Primary Examiner—Michael J. Tokar
Attorney, Agent, or Firm—Thomas A. Briody; Jack E. Haken; Jack D. Slobod

[57] ABSTRACT

The invention relates to a method of generating a selective 180° rf pulse is formed by means of two selective 90° rf pulses. Halfway between the two rf pulses there is generated a non-selective 180° rf pulse which ensures that the excited nuclear magnetization is independent of the homogeneity of the steady magnetic field of the magnetic resonance examination apparatus.

4 Claims, 2 Drawing Sheets

MAGNETIC RESONANCE EXAMINATION APPARATUS AND METHOD OF OPERATION THEREOF

BACKGROUND OF THE INVENTION

1. Field of the Invention

The invention relates to a magnetic resonance examination apparatus and method of operation thereof in which two 90° rf pulses are generated in the presence of a magnetic gradient field in order to generate a selective 180° rf pulse.

2. Description of the Related Art

A magnetic resonance examination method of this kind is known from EP-OS 143 602. The known method concerns a spin echo sequence in which, after a 90° rf pulse, two 90° rf pulses are generated, at a short distance in time from one another, in the presence of a magnetic gradient field, which 90° rf pulses serve to act together as one 180° rf pulse.

A selective rf pulse is to be understood to mean herein an rf pulse which influences the nuclear magnetization only in a part of the space exposed to uniform, steady magnetic field (always required during magnetic resonance examinations) and the field of the rf coil generating the rf pulses. A 90° rf pulse and a 180° rf pulse are to be understood to mean an rf pulse which rotates the nuclear magnetization, or vector components thereof, through 90° and 180°, respectively.

The generating of two closely successive selective 90° rf pulses instead of a single selective 180° rf pulse offers various advantages. On the one hand, the product of power and bandwidth required is thus cut in half; on the other hand, it is substantially simpler to determine the variation in time of a selective 90° rf pulse than of a selective 180° rf pulse. This is because for small flip angles (i.e. the angle wherethrough the nuclear magnetization is rotated with respect to the direction of the uniform, steady magnetic field) a substantially linear relationship exists between the spectrum of the rf pulse and the profile of the layer to be excited by this rf pulse. The variation in time of an rf pulse can thus be obtained by means of a simple Fourier transformation of the pulse spectrum which is proportional to the layer profile. However, this is applicable only to flip angles up to approximately 90°. This method fails for flip angles of 180°; in that case exact solution of the Block equations is required. Variations in time of the rf pulse may then occur which can be generated only by means of complex technical steps.

The known method also has a further drawback in that the magnitude of the nuclear magnetization in the selectively excited region is also determined by the homogeneity of the steady magnetic field. This may be a drawback notably for inversion recovery sequences where first a selective 180° rf pulse is generated.

SUMMARY OF THE INVENTION

It is an object of the present invention to propose a method of the kind set forth so that inhomogeneities of the steady magnetic field have substantially no effect on the nuclear magnetization in the excited region.

This object is achieved in accordance with the invention in that a non-selective 180° rf pulse is generated halfway between the two selective 90° rf pulses.

The invention is based on the following considerations: when only two selective 90° rf pulses are generated, (without an intermediate 180° rf pulse), the nuclear magnetization, selectively excited by the first rf pulse, will be dephased in a location-dependent manner under the influence of the inhomogeneity of the steady magnetic field, the degree of dephasing depending on the inhomogeneity of the steady magnetic field as well as on the period in time between the two 90° rf pulses. Consequently, when the second selective 90° rf pulse appears, the entire nuclear magnetization cannot be rotated with respect to its direction perpendicular to the direction of the steady magnetic field, but only a part thereof; the remainder stays in the plane perpendicular to the direction of the steady magnetic field and is dephased further or even rotated back again. Because a non-selective 180° rf pulse is generated halfway between the two selective 90° rf pulses, it is achieved that the nuclear magnetization has been fully rephased in the excited region at the instant at which the second rf pulse occurs. Thus, the second selective 90° rf pulse can ensure that the nuclear magnetization rotated by the first 90° rf pulse in a plane perpendicular to the direction of the steady magnetic field is completely rotated in the direction of the steady magnetic field or antiparallel thereto.

The 180° pulse rotates the nuclear magnetization through 180° inside and outside the region to be selectively excited. The two selective 90° rf pulses, however, influence the nuclear magnetization only within a layer-shaped region whose thickness is determined by the bandwidth of the rf pulses and whose magnitude is determined by the magnetic gradient field activated during this rf pulse. This means that, after the three said rf pulses, the nuclear magnetization extends in the direction of the steady magnetic field within the said layer, and extends anti-parallel thereto outside the layer. Generally, however, a reverse path (anti-parallel inside the layer, parallel outside the layer) is desirable. This is achieved in a further version of the invention in that a non-selective 180° rf pulse is generated prior to the first 90° rf pulse or after the second rf pulse.

A device for performing the method, comprising means for generating a uniform steady magnetic field, means for generating an rf magnetic field extending perpendicularly thereto and means for generating magnetic gradient fields, and also comprising a control unit for controlling the rf magnetic fields and the gradient fields, is characterized in that the control means are constructed so that a first 90° rf pulse is generated simultaneously with a magnetic gradient field, after which a 180° rf pulse is generated in the absence of magnetic gradient fields, a second 90° rf pulse being generated after activation of the magnetic gradient field, the distance in time between said second 90° rf pulse and the 180° rf pulse amounting to half the distance in time between the second 90° rf pulse and the first 90° rf pulse.

BRIEF DESCRIPTION OF THE DRAWINGS

The invention will be described in detail hereinafter with reference to the drawing. Therein.

DESCRIPTION OF THE PREFERRED EMBODIMENTS

Figure 1:
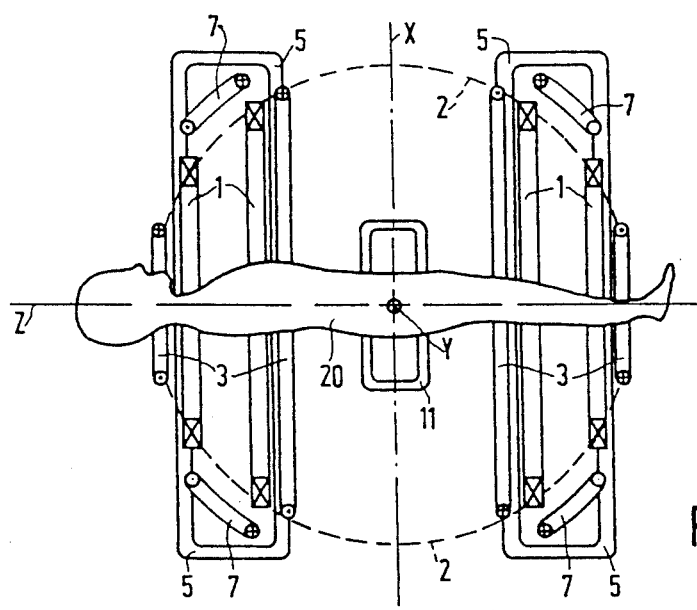
FIG. 1 shows a magnetic resonance examination apparatus in which the invention can be used.

The magnetic resonance tomography apparatus which is diagrammatically shown in FIG. 1 comprises a system of four coils 1 for generating a uniform, steady magnetic field which may be in the order of magnitude of some tenths of T to some T. This field extends in the z-direction of a cartesian coordinate system. The coils 1 which are concentrically arranged with respect to the z-axis can be provided on a spherical surface 2. The patient 20 to be examined is arranged inside these coils.

In order to generate a magnetic field Gz which extends in the z-direction and which varies linearly in this direction there are provided four coils 3 which are preferably arranged on the same spherical surface. There are also provided four coils 7 which generate a magnetic gradient field (i.e. a magnetic field whose strength varies linearly in one direction) Gx which also extends in the z-direction, but whose gradient extends in the x-direction. A magnetic gradient field Gy which extends in the z-direction and which has a gradient in the y-direction is generated by four coils 5 which may have the same shape as the coils 7 but which are arranged so as to be shifted through 90° with respect thereto. Only two of these four coils are shown in FIG. 1.

Because each of the three coil systems 3, 5 and 7 for generating the magnetic gradient fields Gz, Gy and Gx is symmetrically arranged with respect to the spherical surface 2, the field strength at the centre of the sphere, at the same time being the origin of said cartesian xyz coordinate system, is determined only by the steady, uniform magnetic field of the coil system.

Furthermore, symmetrically with respect to the plane z=0 of the coordinate system there is arranged an rf coil 11 which is constructed so that it generates an essentially uniform rf magnetic field which extends in the x-direction, i.e. perpendicularly to the direction of the steady, uniform magnetic field. The rf coil receives an rf current from an rf generator 4 during each rf pulse. Subsequent to one or more rf pulses, the rf coil 11 can serve for the reception of spin resonance signals generated in the examination region. However, a separate rf receiver coil can also be used for this purpose.

Figure 2:
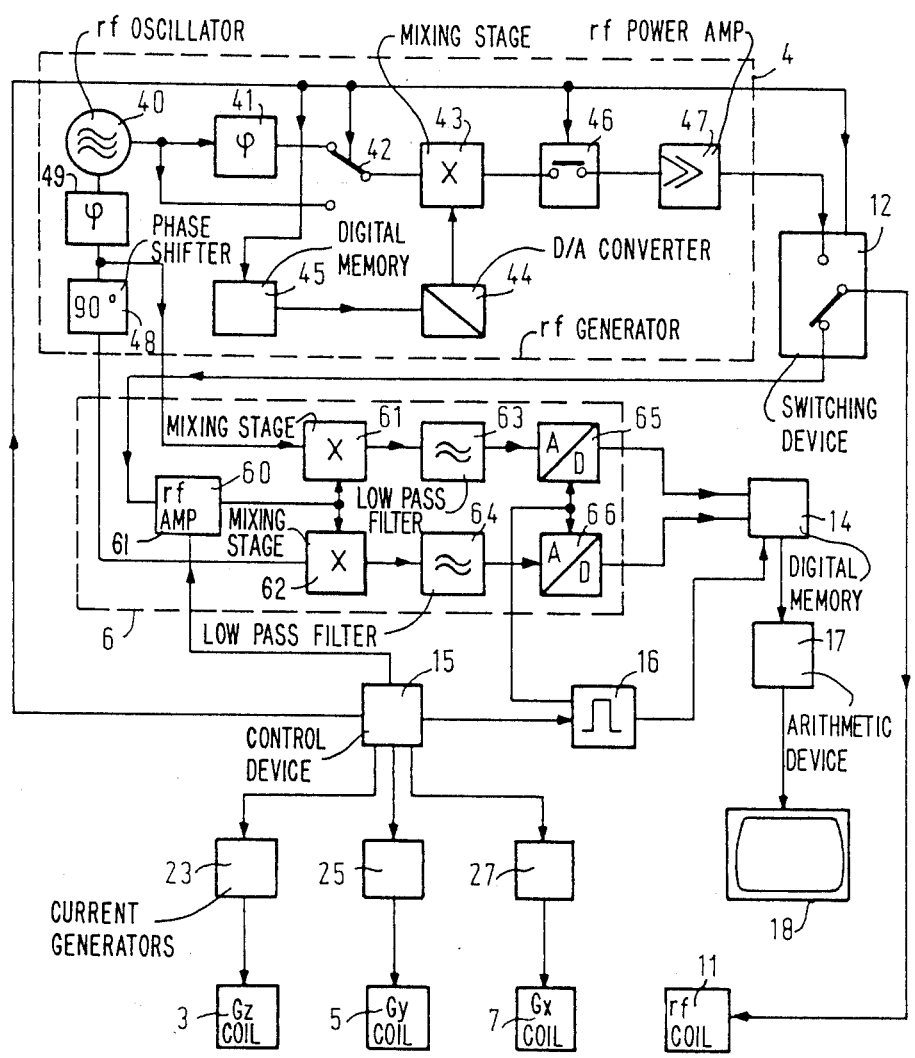
FIG. 2 shows a block diagram of such an apparatus, and FIG. 3 (ab) shows the position in time of the rf pulses and the magnetic gradient field when use is made of the method in accordance with the invention.

FIG. 2 shows a simplified block diagram of such a magnetic resonance examination apparatus. The rf coil 11 is connected, via a switching device 12, to an rf generator 4 on the one side and to an rf receiver 6 on the other side.

The rf generator 4 comprises an rf oscillator 40 whose frequency can be digitally controlled and which supplies oscillations having a frequency equal to the Larmor frequency of the nuclei to be excited at the field strength generated by the coils 1. As is known, the Larmor frequency f is calculated in accordance with the relation f =cB, where B is the magnetic induction in the steady, uniform magnetic field and c is the gyromagnetic ratio which, for example for protons, amounts to 42.56 MHz/T. The output of the oscillator 40 is connected to an input of a mixing stage 43. The mixing stage 43 receives a second input signal from a digital-to-analog converter 44 whose output is connected to a digital memory 45. Under the control of a control device 15, a series of digital data words which form an envelope signal is read from the memory.

The mixing stage 43 processes the input signals applied thereto so that the carrier oscillation modulated with the envelope signal appears on its output. The output signal of the mixing stage 43 is applied, via a switch 46 which is controlled by the control device 15, to an rf power amplifier 47 whose output is connected to the switching device 12. This latter device is also controlled by the control device 15.

The receiver 6 comprises an rf amplifier 60 which is connected to the switching device and which receives the echo signal induced in the rf coil 11; the switching device should then occupy the corresponding position. The amplifier 60 has a muting input 61 which is controlled by the control device 15 and via which it can be blocked so that the gain is substantially zero. The output of the amplifier is connected to the first inputs of two multiplying mixing stages 61 and 62, each of which supplies an output signal which corresponds to the product of its input signals. The second inputs of the mixing stages 61 and 62 receive a signal having the frequency of the oscillator 40, a phase shift of 90° existing between the signals on the two inputs. This phase shift is formed by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via lowpass filters 63 and 64 which suppress the frequency supplied by the oscillator 40 as well as all higher frequencies and which conduct lower frequency components, to a respective analog-to-digital converter 65, 66, respectively. These converters convert the analog signals of the circuit 61 ... 64, forming a quadrature demodulator, into digital data words which are applied to a memory 14. The analog-to-digital converters 65 and 66 as well as the memory 14 receive their clock pulses from a clock pulse generator 16 which can be blocked and released by the control device 15 via a control lead, so that the signals supplied by the rf coil 11 and transposed to the lower frequency range can be converted into a series of digital data words for storage in the memory 14 only during a measuring interval which is defined by the control device 15.

The three coil systems 3, 5 and 7 receive a current from respective current generators 23, 25 and 27, which current can be varied in time under the control of the control unit 15. The data words or sampling values stored in the memory 14 are applied to an arithmetic device 17 which determines therefrom, using discrete Fourier transformation, the spectral distribution of the nuclear magnetization and which outputs this distribution to a suitable reproduction device, for example a monitor 18.

Figure 3:
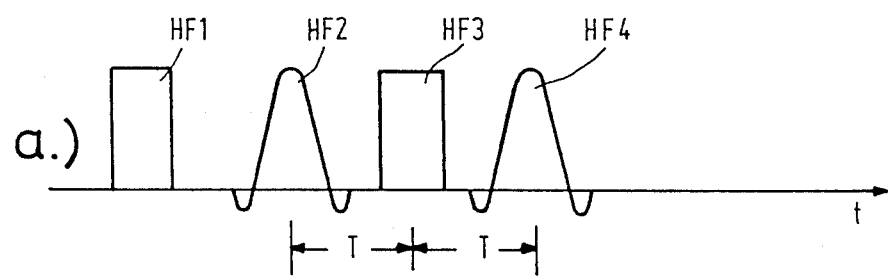
Figure 3:
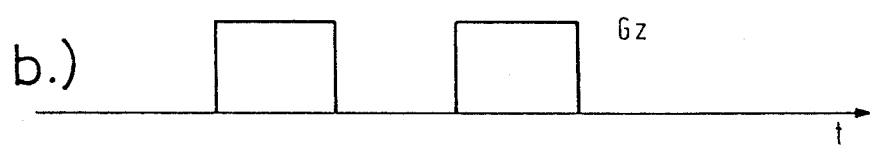

FIG. 3 shows the position in time of the rf pulses with respect to one another and with respect to the magnetic gradient field which serves for the layer selection, FIG. 3a shows the rf pulses and FIG. 3b shows the magnetic gradient field. As appears from FIG. 3aa, first a non-selective 180° rf pulse HF1 is generated. The band of this rf pulse may be comparatively narrow and it may also have a comparatively small power. Because no magnetic gradient field is activated during this rf pulse, the nuclear magnetization is rotated through 180°, i.e. in the anti-parallel (-z)-direction with respect to the steady field, throughout the region covered by the coil 11.

After a period of time, the first non-selective 180° rf pulse HF1 is followed by a first selective 90° rf pulse HF2. The control unit 15 controls the current generator 23 for the gradient coils 3 so that a magnetic gradient field Gz having a gradient in the z-direction is activated during the rf pulse HF2. Thus, the rf pulses HF2 influences the nuclear magnetization only in a layer which extends perpendicularly to the z-axis and whose thickness is determined by the bandwidth of the rf pulse HF2 and by the gradient of the magnetic gradient field. The rf pulse ensures that the nuclear magnetization is rotated through 90° ith respect to the -z-direction in the x-y plane in said layer.

After a period of time T subsequent to the first selective 90° rf pulse HF2, a second non-selective 180° rf pulse HF3 is generated; this second non-selective 180° f pulse may have the same variation in time as the rf pulse HF1. Because no magnetic gradient field is activated during this rf pulse, it influences the nuclear magnetization within as well as outside the layer. Outside the layer, the rf pulse HF3 rotates the nuclear magnetization back to the +z-direction again in which it extended prior to the first rf pulse HF1. The nuclear magnetization in the layer excited by the rf pulse HF2 remains in the x-y plane also after the excitation. However, due to the rf pulse HF3, the nuclear magnetization within the layer, dephased after the selective rf pulse HF2 by the inhomogeneities of the steady magnetic field, is rephased again, so that at the instant T after the second 180° rf pulse HF3 the nuclear magnetization has the same phase throughout the excited layer.

Therefore, at the instant T after the second 180° rf pulse HF3 there is activated a second selective 90° rf pulse HF4. The variation in time of this rf pulse may be the same as that of the rf pulse HF2, and during this rf pulse the magnetic gradient field Gz is again activated with the same magnitude of the gradient. As a result, the nuclear magnetization in the excited layer is rotated about the same axis, extending perpendicularly to the z-axis, as during the first rf pulse and in the same direction of rotation, so that the nuclear magnetization inside the layer extends in the −z-direction, whilst it remains in the +z-direction outside the layer.

The four rf pulses HF1 . . . HF4 thus have the effect of a selective 180° rf pulse. Such an rf pulse may form part of a sequence which is not shown in FIG. 3. Such a sequence can comprise further rf pulses after the four rf pulses HF1 . . . HF4, for example a 90° rf pulse such as in the case of an inversion recovery sequence. In order to generate a magnetic resonance tomogram, further, similar sequences can be generated, merely the amplitude and duration of one of the gradient fields Gx, Gy being varied from one sequence to another.

Generally, the polarity of the magnetic gradient field linked to a selective rf pulse is reversed after the rf pulse after which it is deactivated so that the time integral over the magnetic gradient field from the centre of the rf pulse to the instant of deactivation has exactly the value zero. This serves to achieve that the phase position of the nuclear magnetization is independent of the location in the direction perpendicular to the excited layer. Such a variation in time of the magnetic gradient field can also be used for the rf pulses HF2 and HF4, but is not required. This is because, if the phase of the nuclear magnetization were location dependent after the first 90° rf pulse, the second 180° rf pulse HF3 would ensure that the phase position of the nuclear magnetization would be the same throughout the layer upon appearance of the 90° rf pulse HF4. After the second selective 90° rf pulse HF4, the nuclear magnetization inside the layer extends anti-parallel with respect to the direction of the steady magnetic field. Because, contrary to the situation where the nuclear magnetization extends in the x-y plane, neither dephasing nor rephasing can occur, it not be ignored that the polarity of the magnetic gradient field linked to the second 90° rf pulse HF4 does not change subsequent to this pulse.

In the described example, the gradient of the magnetic gradient field extends in the same direction during the first as well as during the second 90° rf pulse, (HF2 and HF4, respectively). However, the gradient may alternatively extend in the opposite direction during the second rf pulse in comparison with the first rf pulse. This can be achieved by inverting the polarity of the current which is supplied by the current generator 23 and which traverses the gradient coil 3 for the second 90° rf pulse HF4.

Instead of a layer extending perpendicularly to the z-axis, a layer which is oriented differently can also be excited, for example a layer extending perpendicularly to the x-axis or the y-axis. In that case the current generator 25 or 27 for powering the gradient coils 5 or 7, respectively should supply a corresponding current. It is again important that during the second rf pulse the magnetic gradient field extends in the same or in the opposite direction with respect to the first rf pulse.

What is claimed is:

1. A magnetic resonance examination method in which an excitation sequence includes first and second 90° rf pulses (HF2, HF4) each generated in the presence of a magnetic gradient field, said first and second 90° rf pulses being sufficiently close to each other in time in order to act together as a selective 180° rf pulse, characterized in that a first non-selective 180° rf pulse (HF3) is generated halfway between the first and second selective 90° rf pulses (HF2, HF4).

2. A method as claimed in claim 1, characterized in that said excitation sequence includes a second non-selective 180° rf pulse (HF1) which is generated prior to the first 90° rf pulse (HF2) or after the second 90° rf pulse (HF4), said first and second 90° rf pulses and first and second 180° rf pulses all acting together as a selective 180° rf pulse.

3. Magnetic resonance examination apparatus comprising means for generating a uniform steady magnetic field, means for generating an rf magnetic field extending perpendicularly thereto, means for generating magnetic gradient fields, and a control unit for controlling the means for generating the rf magnetic field and the gradient fields; characterized in that the control unit (15) controls the field generating means to generate a first 90° rf pulse (HF2) simultaneously with generation of a magnetic gradient field, then a 180° rf pulse (HF3) in the absence of said magnetic gradient field, then a second 90° rf pulse (HF4) after activation of said magnetic gradient field; the time (T) between said 180° rf pulse and said second 90° rf pulse amounting to half the time (2T) between the first 90° rf pulse and the second 90° rf pulse, said time (2T) between said first and second 90° rf pulses (HF1, HF2) being sufficiently small that said first and second 90° rf pulses act together as a selective 180° rf pulse.

4. The apparatus of claim 3, wherein said control unit (15) controls the field generating means to generate a second 180° rf pulse (HF1) in the absence of said magnetic gradient field prior to said first 90° rf pulse (HF2) or after the second 90° rf pulse (HF4), said first and second 90° rf pulses and first and second 180° rf pulses all acting together as a selective 180° rf pulse.

* * * * *